United States Patent [19]

Hooke et al.

[11] Patent Number: 5,648,701
[45] Date of Patent: Jul. 15, 1997

[54] ELECTRODE DESIGNS FOR HIGH PRESSURE MAGNETICALLY ASSISTED INDUCTIVELY COUPLED PLASMAS

[75] Inventors: William M. Hooke; Brian R. Stoner; Steven P. Bozeman; Roy E. Fauber, all of Chapel Hill, N.C.; Tobin L. Munsat, Princeton, N.J.; Sean Washburn, Chapel Hill, N.C.

[73] Assignees: The University of North Carolina at Chapel Hill, Chapel Hill; Kobel Steel USA, Inc., Research Triangle Park, both of N.C.

[21] Appl. No.: 267,562

[22] Filed: Jun. 28, 1994

Related U.S. Application Data

[63] Continuation-in-part of Ser. No. 938,796, Sep. 1, 1992, abandoned.

[51] Int. Cl.⁶ .................................................. H01J 7/24
[52] U.S. Cl. ................... 315/111.21; 315/111.41; 315/111.51; 315/111.71; 315/111.81; 315/111.91
[58] Field of Search ....................... 315/111.21, 111.41, 315/111.51, 111.71, 111.81, 111.91

[56] References Cited

U.S. PATENT DOCUMENTS

| | | |
|---|---|---|
| 3,084,281 | 4/1963 | Mills . |
| 3,278,796 | 10/1966 | Takei et al. . |
| 3,442,758 | 5/1969 | Penfold et al. . |
| 3,663,858 | 5/1972 | Lisitano . |
| 4,058,748 | 11/1977 | Sakudo et al. . |
| 4,417,178 | 11/1983 | Geller et al. . |
| 4,431,898 | 2/1984 | Reinberg et al. . |
| 4,431,901 | 2/1984 | Hull . |
| 4,438,368 | 3/1984 | Abe et al. . |
| 4,727,293 | 2/1988 | Asmussen et al. . |
| 4,745,338 | 5/1988 | Hollis, Jr. et al. . |
| 4,766,351 | 8/1988 | Hull et al. . |
| 4,849,675 | 7/1989 | Müller . |
| 4,857,809 | 8/1989 | Torii et al. . |
| 4,948,458 | 8/1990 | Ogle . |

FOREIGN PATENT DOCUMENTS

| | | |
|---|---|---|
| 0379828 | 8/1990 | European Pat. Off. . |
| 0413282 | 2/1991 | European Pat. Off. . |
| 0489407 | 6/1992 | European Pat. Off. . |
| 0552491 | 7/1993 | European Pat. Off. . |

OTHER PUBLICATIONS

R.V. Mitin et al., *Magnetic Properties of a High–Pressure Electrodeless Discharge,* Soviet Physics—Technical Physics, vol. 11, No. 5, pp. 672–676 (1966).

R.V. Mitin et al., *Magnetic Field Influence on High–Pressure Electrodeless Discharge Plasma,* High Pressure Discharges, Panel 3.2.10 Arcs and Discharges in Magnetic Fields, p. 249.

P. Zhu et al., *A New Argon–Ion Laser Based on an Electrodeless Plasma,* J. Appl. Phys., vol. 68, No. 5, pp. 1981–1984 (1990).

K.K. Pryadkin et al., *Electrodeless Discharges at High Pressure,* Soviet Physics—Technical Physics, vol. 13, No. 5, pp. 618–622 (1968).

A.J. Perry et al., *The Application of the Helicon Source to Plasma Processing,* J. Vac. Sci. Technol. B., vol. 9, No. 2, pp. 310–317 (1991).

R. Anghelova et al., *An Experimental Study of the Axial Structure of a Gas Discharge Sustained by a Surface Electromagnetic Wave in the Presence of a Uniform External Magnetic Field,* Journal of Physics D. Applied Physics, vol. 21, No. 9, pp. 1371–1376 (1988).

*Primary Examiner*—Frank Gonzalez
*Assistant Examiner*—Reginald A. Ratliff
*Attorney, Agent, or Firm*—Bell, Seltzer, Park & Gibson, P.A.

[57] ABSTRACT

A plasma system is disclosed comprising a vessel suitable for containing a plasma at a pressure of at least about 100 mtorr, a plasma gas in the vessel at a pressure of at least 100 mtorr, an antenna with a substantially planar face positioned adjacent a portion of the vessel for applying an electromagnetic field to the plasma gas to thereby generate and maintain a plasma, and means for applying an external magnetic field to the plasma gas other than the field generated by the antenna, and having a component in a direction substantially perpendicular to the planar face of the antenna.

63 Claims, 5 Drawing Sheets

ELECTRODE DESIGNS FOR HIGH PRESSURE MAGNETICALLY ASSISTED INDUCTIVELY COUPLED PLASMAS

FIELD OF THE INVENTION

This is a continuation in part of U.S. patent application Ser. No. 07/938,796; filed Sep. 1, 1992 now abandoned. The present invention relates to plasma systems, and in particular relates to a method of assisting, controlling and enhancing inductively coupled plasmas maintained at high pressures.

BACKGROUND OF THE INVENTION

A plasma is a natural mixture of positively and negatively charged particles interacting with an electromagnetic field which dominates their motion and in which temperatures of 10,000° to 15,000° C. can be reached. Plasmas can be utilized as energy sources in many useful applications. Such plasmas are also referred to by some as "particle plasmas" in order to differentiate them from "reactor plasmas" which are composed of positively charged ions of hydrogen isotopes and used in nuclear fusion devices where temperatures of 74,000,000° C. have been obtained. Reactor plasmas, however, also respond to electromagnetic forces.

In the plasmas referred to herein, gases are typically raised to a very high temperature by applying radio frequency ("RF") power from an alternating current (AC) source to a coil encircling a working gas which is partially ionized. Radio frequencies are generally considered to be that portion of the electromagnetic spectrum between about 1 and 100 megahertz (MHz), but it is generally understood that this is a descriptive range rather than a limiting one, as some definitions include frequencies up to about 300 MHz in the RF region.

Such a system is referred to as an inductively coupled plasma (ICP) and can be used for a large variety of industrial purposes. For example, in induction plasma torches, a high power, high pressure inductively coupled plasma is used for vapor deposition, materials testing, bulk spheroidizing, chemical processing, flame hardening, wire or rod surface treatment, propulsion simulation, melting or vaporization, and generation of intense light. High pressure ICP's are also used extensively for analytical atomic spectroscopy, and more recently high pressure ICP's have been used for the plasma assisted deposition of diamond and diamond-like films.

Related processes include direct coupled plasmas in which the plasma-generating electrodes are placed directly within the plasma chamber, and capacitively coupled plasmas in which the power source is coupled to the plasma chamber. U.S. Pat. No. 4,431,898 gives appropriate descriptions of these systems, and particularly of inductively coupled plasma systems.

Inductively coupled plasmas can be broadly divided into two classes, low pressure and high pressure. Although the differential is to some extent arbitrary, in general low pressure plasmas are formed in working gases having pressures below about 5 pascal (100,000 pascal=1 atmosphere), and a high pressure ICP's are considered to range from about 5 pascal's (Pa) up to atmospheric pressure or greater. Using torr as the unit of pressure measurement, sustainable plasmas tend to fall in the range of between about 100 mtorr to 100 torr (760 torr equals one atmosphere).

The major problems associated with practical use of inductively coupled plasmas results from the operator's lack of control over the fundamental physical aspects of the plasma gas system. For example, once the pressure, gas mix, flow rates, RF frequency, and RF power have been fixed, there exists no ability to change the radio frequency wave penetration into the plasma (referred to as skin depth), the plasma's conductivity, its diffusion, its stability, or the overall plasma configuration. The overall size of an ICP plasma is also limited by the skin depth, so that shallower skin depths produce smaller plasmas.

Furthermore, in high pressure inductively coupled plasmas, the radio frequency power is absorbed very near the plasma surface. This surface absorption leads in turn to other fundamental problems: first, much of the plasma energy diffuses immediately to the walls of the plasma's containment vessel and is lost; and second, because the RF energy is absorbed at the surface, the gas temperatures are not uniform over a cross section of the plasma ("skin effects"). In turn, because the plasma energy is lost in the vessel walls, there is a significant loss in the efficiency of the RF power usage. Because of the lack of uniform temperatures, etching, deposition or atomic deposition are similarly non-uniform.

Additionally, some plasmas, for example hydrogen plasmas, typically have a relatively low conductivity and correspondingly high RF power is required to sustain them magnifying the efficiency and energy loss problems.

One manner of controlling phenomena responsive to electromagnetic energy, is the use of a magnetic field. A magnetic field can help control the charged particles in a plasma by keeping them along field lines. Additionally, a magnetic field can increase the energy transfer from the RF source to the plasma.

Magnetic fields have not been used with high pressure inductively coupled plasmas, however, because to date it has been assumed that a magnetic field will have no effect on a high pressure ICP because the collision frequency (higher pressure means larger numbers of atoms and molecules) is higher than the RF frequency. Stated differently, the conventional theory holds that in a high pressure inductively coupled plasma, the large number of collisions will eliminate any effect that could be accomplished with the magnetic field.

Nevertheless, higher pressure plasmas do have desirable potential for some of the techniques referred to earlier. In particular, at higher pressure, more atoms are present. Accordingly, the rates of plasma processes can be directly proportional to the plasma pressure. Thus, faster, better, and more efficient processes would accordingly be expected from such plasmas if the problems of skin effects and energy efficiency could be addressed.

As is known to those familiar with plasma processes, the high temperatures generated are useful in processing materials that are stable at lower temperatures. Diamond is an example of one such material, and as interest grows in diamond's use for semiconductor devices, an associated interest in diamond processing likewise increases. One such processing technique is the use of plasmas in various steps of growth, nucleation, and processing of diamond, usually in thin-film form. Because thin film semiconductors must usually be in single crystal (polytype) and quite pure form (other than intentional doping), the processes used in their manufacture must be subject to reasonable control.

As set forth above, the useful behavior of a plasma can be enhanced by the application of a magnetic field other than the field associated with the RF electric field that generates the plasma. The magnetic field produces a deeper skin depth, permits larger and more stable plasmas, and reduces the thermal stress on vessel walls (a function of the deeper skin depth).

One particularly useful application for well-controlled or controllable plasmas is in the growth and nucleation of diamond thin films, which in turn are precursors of diamond-based semiconductors. As known to those familiar with semiconductor materials and devices, the physical and electronic properties of diamond make it a quite desirable candidate material for a wide range of semiconductor devices.

Single crystal diamond thin films are quite difficult to fabricate, however, in the large areas (1" or more) required for the practical manufacture of diamond-based semiconductor devices. Some successes have been accomplished, however, using plasma chemical vapor deposition (CVD); see e.g., Stoner et al., *Textured Diamond Growth on (100) β-SiC via Microwave Plasma Chemical Vapor Deposition*, Appl. Phys. Lett., Vol. 60, No. 6, Feb. 10, 1992, pp. 698–700; and Stoner et al., *Highly Oriented, Textured Diamond Films on Silicon via Bias-Enhanced Nucleation and Textured Growth*, J. Mater. Res., Vol. 8, No. 6, June 1993, pp. 1334–1340.

Accordingly, improvements in the control of plasmas, including increases in plasma size, offer tremendous potential for corresponding gains in the nucleation and growth of highly oriented diamond layers, including single crystal diamond layers, and in resulting diamond-based semiconductor devices.

As another desirable aspect of plasmas, however, particularly those used to process diamond thin-films, is the potential to produce a plasma with a substantially flat surface; i.e., one that tends to match the flat surface geometry of such a thin film. Such flat plasmas (i.e., flat on at least one surface) can be produced using flat electrodes or flat coils in radio frequency inductively coupled plasmas. Ideally, flat plasmas can provide uniform and rapid processing of semiconductor or integrated circuit substrates in single wafer form, and over large (i.e., greater than 4" diameter) areas.

To date, however, and particularly in the area of semiconductor processing, flat coil plasmas suffer from some inherent weaknesses. Basically, as known to those familiar with electromagnetic fields, a field generated by a coil is strongest where the radius of the coil is largest. Additionally, the field strength always decreases as the distance from the coil decreases. Thus, for smaller coils (or for the smaller turns in coils with large and small coils), the field strength decreases even faster.

This combination of factors causes flat coils to tend to produce "donut" fields; i.e., fields that have stronger and weaker portions (temperature, pressure, population) in patterns roughly similar to concentric circles. As might be expected, such an uneven pattern can be less useful in certain plasma applications, particularly any desired uniform treatment of diamond or other semiconductor thin films.

These problems can be further exacerbated in higher-pressure plasmas (particularly those of about 100 mtorr or greater) because lower-pressure plasmas diffuse more easily than higher pressure plasmas; i.e., the higher pressure prevents or hinders the diffusion that can help make a plasma more uniform. As a result, higher pressure plasmas have a further tendency to become less uniform.

Finally, higher pressure plasmas require stronger fields to sustain them, and these stronger fields—as noted above—tend to produce uneven plasmas.

Therefore, the need exists for techniques and processes in which a plasma can be produced with a substantially flat face, at high pressure, and with sufficient uniformity in the flat face to make it useful for the desired semiconductor processes.

OBJECT AND SUMMARY OF THE INVENTION

Therefore, it is an object of the present invention to provide a system for controlling and enhancing an inductively coupled plasma at high pressure.

The invention meets this object by providing a method and an associated apparatus for controlling an inductively coupled plasma comprising applying an external magnetic field to an inductively coupled plasma in which the gas pressure in the plasma is 5 pascal or greater.

In another aspect the invention comprises an antenna for producing a uniform plasma at pressures of at least 100 millitorr (mtorr), in which the antenna comprises at least one portion that forms a substantially planar configuration other than an Archimedean spiral. As used herein, the term spiral refers to the path (generally planar) of a point that moves round an axis while continuously receding from (or approaching) it. An Archimedean Spiral is defined as a plane curve generated by a point moving away from or toward a fixed point at a constant rate while the radius vector from the fixed point rotates at a constant rate.

In a further aspect, the invention is a plasma system comprising a vessel suitable for containing a plasma at a pressure of at least about 100 mtorr; a plasma gas in the vessel at a pressure of at least 100 mtorr; an antenna with a substantially planar face positioned adjacent a portion of the vessel for applying an electromagnetic field to the plasma gas to thereby generate and maintain a plasma; and means for applying an external magnetic field to the plasma gas other than the field generated by the antenna, and having a component in a direction substantially perpendicular to the planar face of the antenna.

In yet another aspect the invention is a method of generating a uniform plasma at pressures of at least about 100 mtorr, in which the method comprises applying an electromagnetic field from a substantially planar antenna to a plasma gas at a pressure of at least about 1 torr to thereby generate and maintain a plasma; and applying an external magnetic field to the plasma gas other than the field generated by the substantially planar antenna, and with the applied external magnetic field having a component in a direction substantially perpendicular to the planar face of the antenna.

The foregoing and other objects, advantages, and features of the invention, in the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
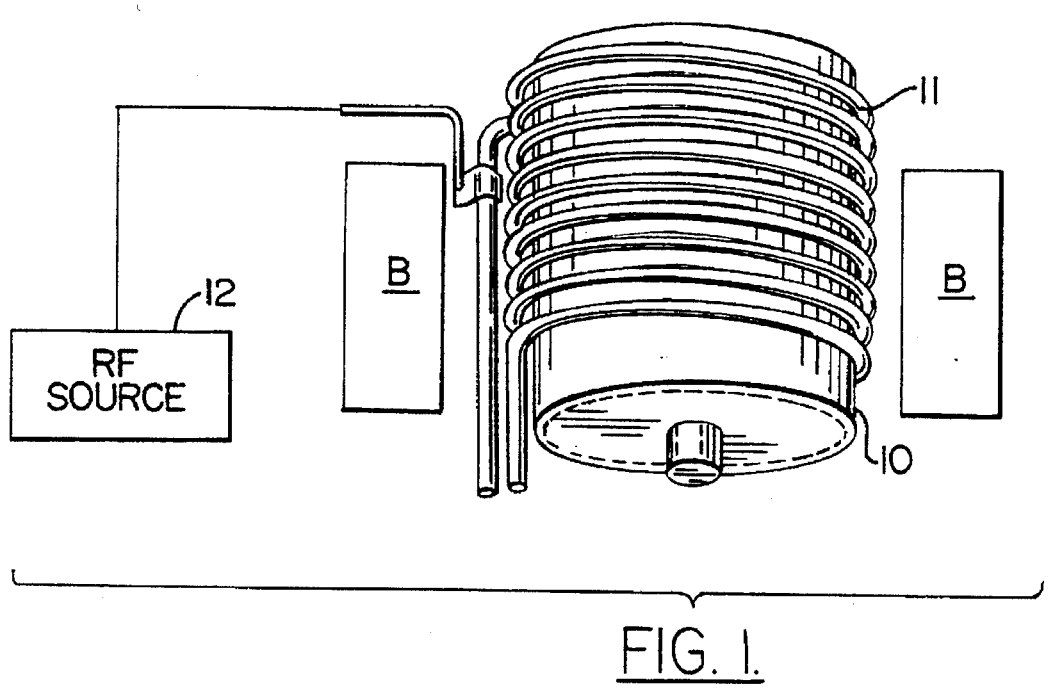
FIG. 1 is a partial schematic and partial perspective view of an inductively coupled plasma system.

In its first aspect, the present invention is a method of controlling an inductively coupled plasma comprising applying an external magnetic field other than the field associated with the induction field to an inductively coupled plasma in which the gas pressure in the plasma is 5 pascal (Pa) or greater. At such pressures, the collision frequencies of the plasma particles are substantially greater than the RF frequency used to drive the electrode. Furthermore, it will be understood by those familiar with electromagnetic radiation and its generation and propagation, that an oscillating (i.e. time-varying) magnetic field is always present and associated with an AC electrical field, and that the magnetic field acts in a direction normal (i.e., perpendicular) to the electric field. It will thus be understood that the present invention relates to the application of an additional external magnetic field to the plasma other than the field associated with the induction coil used to generate the plasma.

The magnetic field can be applied uniformly, or in varying fashion including varying the magnetic field with respect to time, or varying the magnetic field with respect to space. In one particular embodiment, the magnetic field is rotated, while in another the coil axis can be rotated to achieve the same effect.

Although the pressure value which conventionally is used to describe the difference between high and low pressure plasmas is on the order of about 5 Pa, the present invention is applicable at much higher pressures, including pressures of one atmosphere, or even several atmospheres.

Because the invention relates to controlling an inductively coupled plasma, the invention can further comprise the initial steps of applying electromagnetic energy to an induction coil that surrounds a partially ionized working gas at a pressure of more than 5 Pa to thereby define an ionization region and raise the temperature of the gas sufficiently for the gas to obtain the plasma state. The external magnetic field other than the field associated with the induction coil is then applied to the inductively coupled plasma. As just noted, although the dividing line between high and low pressure plasmas is conventionally expressed as about 5 Pa, the invention can comprise applying electromagnetic energy to a working gas maintained at much higher pressures, including pressures of one (1) torr and upward to pressures at least as great as atmospheric pressure.

The step of applying the external magnetic field can similarly comprise applying the field in a manner parallel to the axis of the induction coil, or perpendicular to the axis of the induction coil, or obliquely to the axis of the induction coil.

The plasma can be initiated and sustained in the ionization region in any manner appropriate and known to those familiar with this art such as with a starter coil or similar device.

In another aspect, the invention can comprise the further step of establishing a plasma column in the ionization region, and the further step of rotating the plasma column in the ionization region using the external magnetic field. As will be discussed with respect to the experimental data herein, the step of applying the magnetic field comprises applying a magnetic field sufficient to increase the electromagnetic field penetration of the plasma. In the most preferred embodiment, the applied magnetic field is sufficient to increase the electromagnetic field penetration of the plasma entirely to the center of the plasma.

In yet another embodiment, the invention comprises an inductively coupled plasma system comprising an ionized gas maintained at a pressure of 5 pascal or greater and an external magnetic field applied to the ionized gas. FIG. 1 shows that the plasma system according to the present invention comprises a tube 10 for containing the high pressure ionized gas, an induction coil 11 surrounding the tube 10 and defining the axis of the tube, and means for supplying the coil with radio frequency power. In typical preferred embodiments, and as illustrated in FIG. 1, the tube 10 is formed of quartz, the radio frequency power means is a radio frequency generator 12, and the induction coil 11 is formed of copper tubing. Water can be circulated through the coil 11 to help moderate the high temperatures to which the entire system is exposed by virtue of the plasma's characteristics. Although the illustrated tube is shown as being merely cylindrical, those familiar with plasma systems will recognize that other shapes are appropriate, including circular tubes, toroidal tubes, and other geometries.

Aluminum and gold-plated steel are other appropriate choices for the electrode coil. Quartz and ceramics and various combinations of these materials provide other appropriate choices for the containment vessel. These are also appropriate choices for the embodiments of the invention illustrated in FIGS. 5–12 and discussed later herein. Appropriate plasma gases include argon (Ar), hydrogen ($H_2$), and hydrocarbon gases such as methane ($CH_4$), ethane ($C_2H_6$), ethylene ($C_2H_4$), and acetylene ($C_2H_2$), as well as some higher alkenes and olefins. Air, hydrogen, or hydrocarbon gases are particularly preferred when such plasmas are used for diamond growth and nucleation.

In preferred embodiments the invention further comprises means for varying the magnetic field over space with respect to the access of the tube, and means for varying the magnetic field over time. These are in turn associated with the means illustrated as the magnet B, for applying a magnetic field to the ionized gas. It will also be understood that in additional to a magnet, a secondary coil could be used to generate the appropriate magnetic field.

As in the other embodiments, although a high pressure plasma is conventionally defined as one of 5 Pa or greater, the invention can comprise a plasma with ionized gases maintained at pressures of at least one atmosphere.

Figure 2:
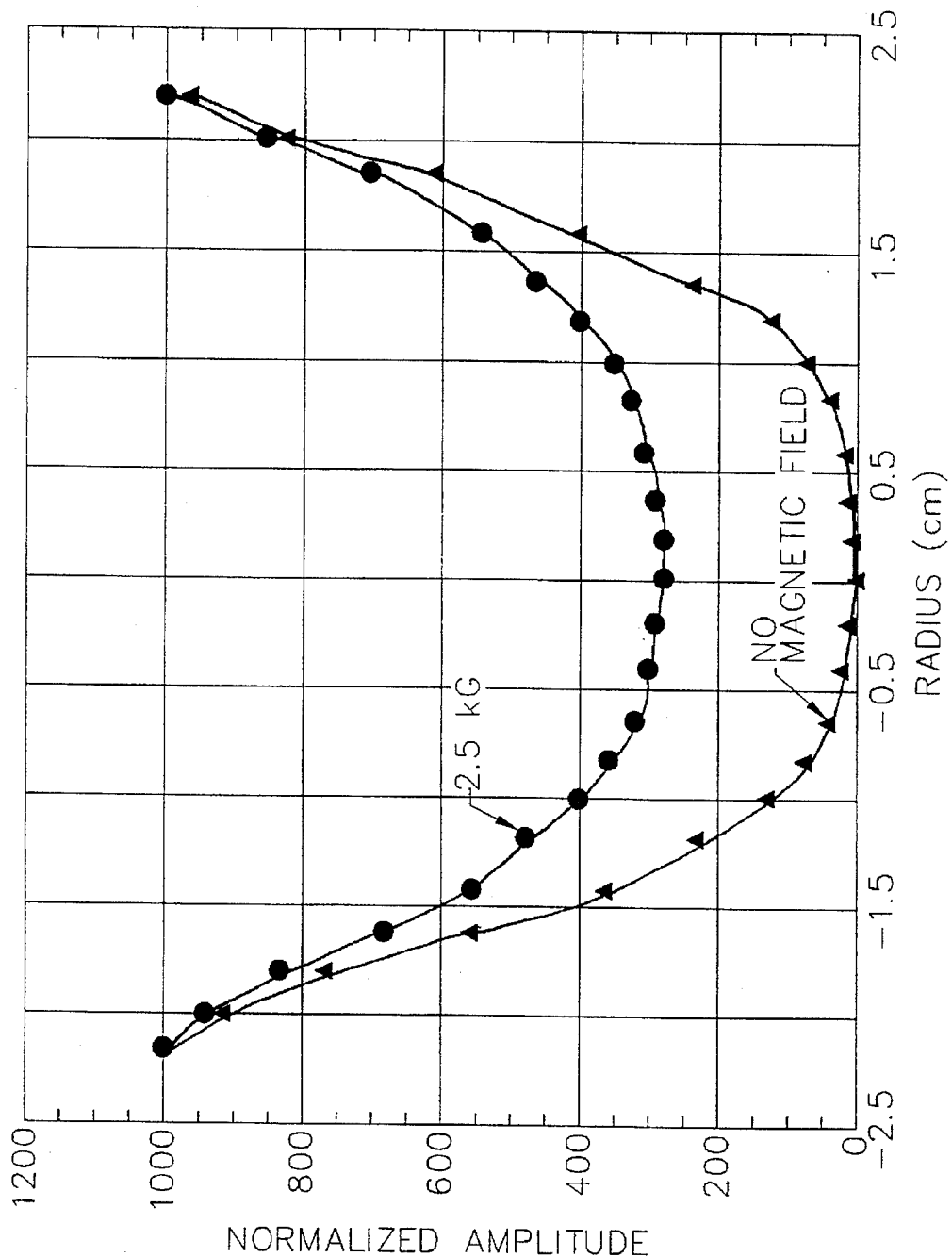
FIG. 2 is a plot of RF amplitude within a plasma control according to the present invention measured with respect to the center of the plasma and the radius outwardly therefrom.
Figure 3:
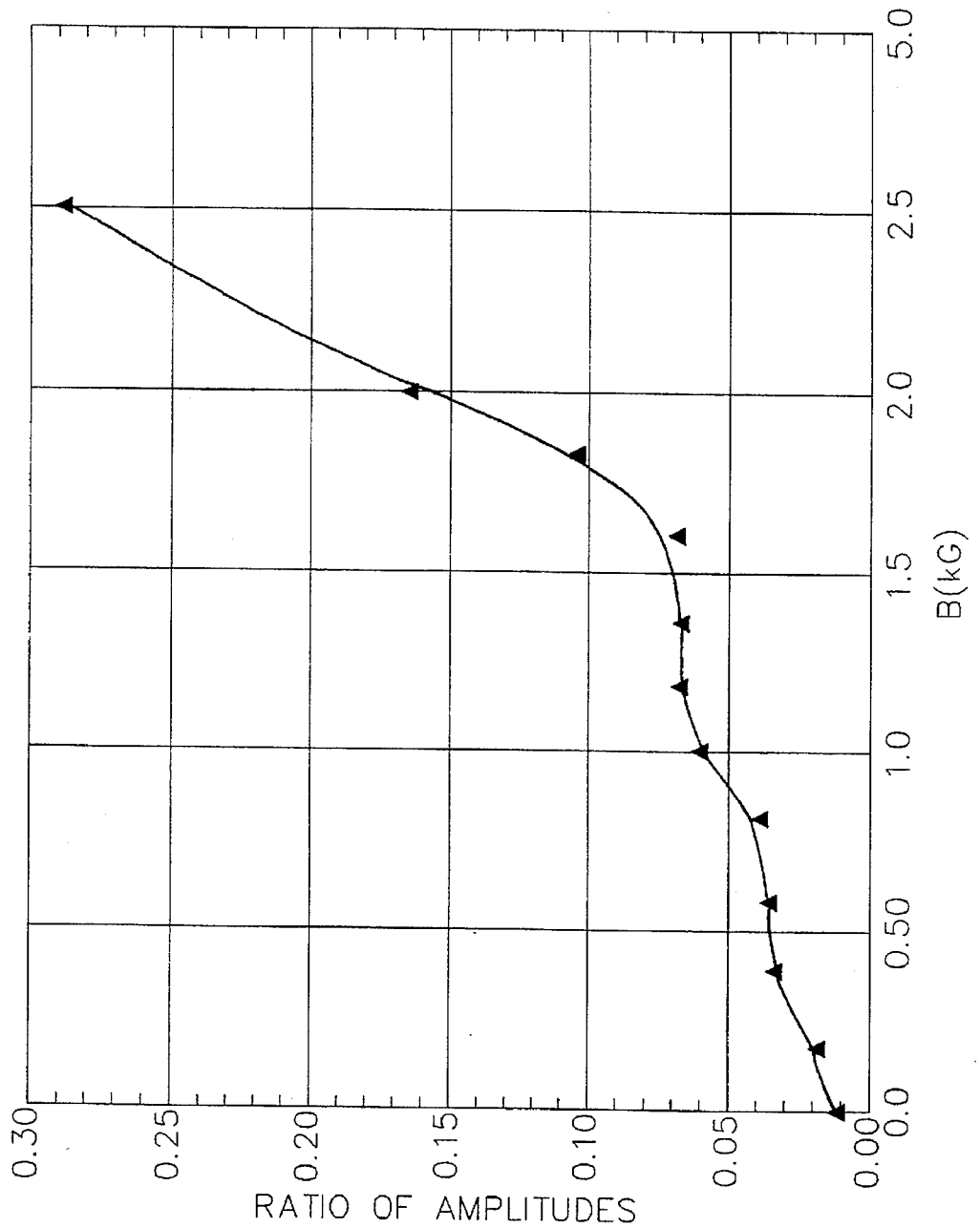
FIG. 3 is a plot of the RF amplitude at the center of a plasma over the amplitude at the edge measured as a function of the applied magnetic field.

FIGS. 2 and 3 demonstrate some of the measured advantages of the invention. FIG. 2 shows the RF magnetic field observed with a small (approximately 2 millimeter) pick-up loop as a function of the radius of the plasma. The origin represents the center of the cylindrical column of plasma, and the plasma edge is approximately 2.3 centimeters (cm). In the absence of a magnetic field, the amplitude of the probe signal falls off with a skin depth of around 1 centimeter. With the application of a 2.5 kiloGauss (kG) field in an argon plasma at a pressure of 260 Pa (2.0 Torr, 1 Torr=130 Pa), the field in the central regimes of the discharge is significantly enhanced.

FIG. 3 plots the electromagnetic field amplitude at the center of the plasma as a function of the magnetic field, and demonstrates that above a critical field (around 1.6 kG), the wave penetration increases very rapidly.

The density of the plasma was also monitored with a spectrometer for Stark effect measurements to verify that the enhanced penetration was not the result of a change in the plasma density upon application of the magnetic field. No changes in density were detected, and it is expected that under increased power the density in the center of the discharge will likewise increase.

The procedures of FIGS. 2 and 3 were carried out using radio frequency power of approximately 1 kW at a frequency of 13.6 megahertz (MHz). The induction coil had 6 turns of length 2-½", with an inside diameter of 2-¼", and constructed of ⅛" water cooled copper tubing. As noted above, the plasma gas was argon at 2.0 Torr at a flow rate of 16 sccm. The magnetic field was 2.5 kG and uniform to within 10% over the plasma volume, which was approximately 4" long and 2" in diameter.

The radio frequency probe used for the amplitude measurements was formed of 5 turns of a 2 millimeter (mm) diameter copper wire of 0.015" diameter. The probe was inserted into a re-entrant quartz tube running radially through the plasma.

The containment vessel was water cooled quartz for which the inner tube had inside diameter of 42 mm and an outer diameter of 46 mm, with the outer tube having an inner diameter of 53 mm and an outer diameter of 57 mm.

In summary, the invention provides a technique for controlling and enhancing high pressure plasmas in a manner that helps define their boundaries, increases their size, raises their efficiency, and boosts the rate at which plasma processes can be carried out.

Figure 4:
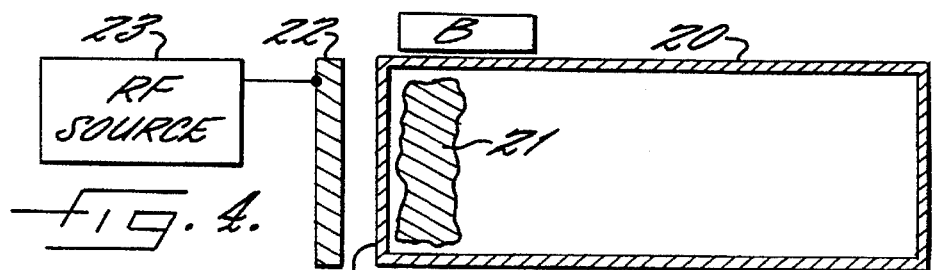
FIG. 4 is a schematic diagram of a flat surface plasma system according to the present invention.

In another aspect, the invention comprises a flat coil arrangement for producing plasmas with flat surfaces and uniform plasma properties. FIGS. 4–12 are illustrative of the advantageous flat coils of the present invention. FIG. 4 is a schematic diagram of an appropriate flat plasma system comprising a vessel 20 suitable for containing a plasma at a pressure of at least about one torr. The vessel 20 is preferably formed entirely of quartz, or of metal with a quartz window 24 adjacent the antenna 22. A plasma gas 21 is present in the vessel at a pressure of at least one torr, and an antenna 22 with a substantially planar face is positioned adjacent a portion of the vessel for applying an electromagnetic field to the plasma gas to thereby generate and maintain a plasma. As noted previously, copper tubing is an appropriate choice for the antenna 22. The system includes means, again designated as B, for applying an external magnetic field to the plasma gas other than the field generated by the antenna, and having a component in a direction substantially perpendicular to the planar face of the antenna. These means can include magnets or electromagnets used in a manner similar to that described earlier. As in the previously described embodiment, an RF generator 23 serves as the RF source.

Figures 5, 6, 7:
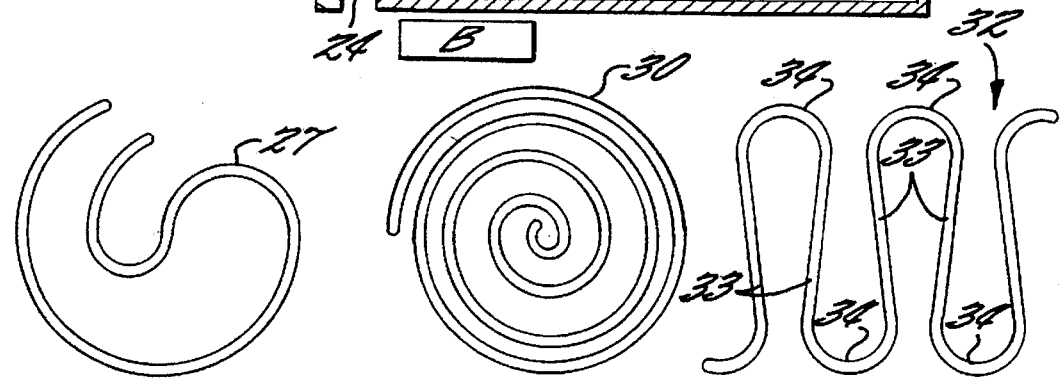
FIGS. 5–12 illustrate various coil geometries according to the present invention.

FIG. 5 is an antenna 27 that provides several advantages and in which the substantially planar portion comprises a single noncircular and preferably asymmetric loop.

FIG. 6 illustrates a flat coil antenna 30 in which the spiral windings provide a modification of an Archimedean-type spiral improved to provide a more uniform plasma at higher pressures according to the present invention. As illustrated in FIG. 6, the substantially planar portion comprises a non-Archimedean coil in which the turns are tighter toward the center of the coil and greater toward the circumference of the coil.

FIG. 7 illustrates an antenna 32 in which the substantially planar portion comprises a series of substantially parallel portions 33 connected by turns 34 at the respective alternating ends of said parallel portions 33. The parallel structure improves the uniformity of the electromagnetic field, and thus of the plasma, especially at higher pressures. The distance between the parallel lines can be easily varied to either spread the plasma or to constrict its size. The coil configuration of FIG. 7 has been demonstrated to be able to generate an H-mode plasma; i.e a plasma with an electron density greater than about $10^{13}$ cm$^{-3}$.

Figure 8:
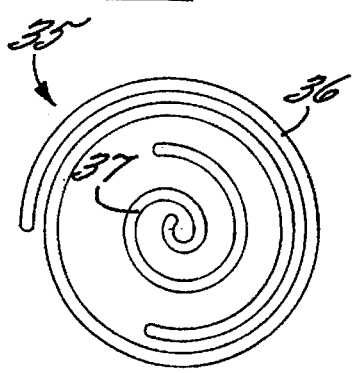

FIG. 8 illustrates an antenna 35 in which the substantially planar portion comprises multiple concentric coils. The embodiment shown in FIG. 8 has two such coils, designated at 36 and 37. This is another improvement over existing spiral flat coil designs and provides independent control of both the inner and outer coils. Independent control of both coils helps make the plasma more uniform with respect to the problems raised by coils described earlier herein. Although two coils are illustrated in FIG. 8, it will be understood that more could be included and that each would be provided with its own electrical feed. Additionally, although the overall electrode 35 is non-Archimedean, the individual coils 36 and 37 could be either Archimedean or non-Archimedean, or indeed one of each.

Figure 9:
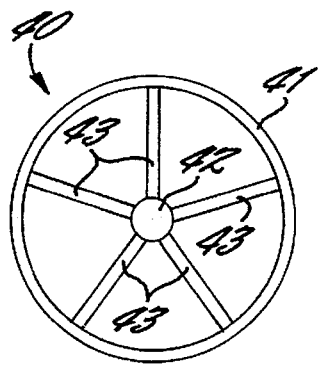

FIG. 9 shows an electrode antenna 40 which eliminates closed loops entirely and thus provides a strong field at the center. As FIG. 9 illustrates, the substantially planar portion comprises a circular perimeter 41, a central hub 42 coaxial with the perimeter 41 and a plurality of substantially linear spokes 43 radiating from the hub 42 to the circular perimeter 41.

Figure 10:
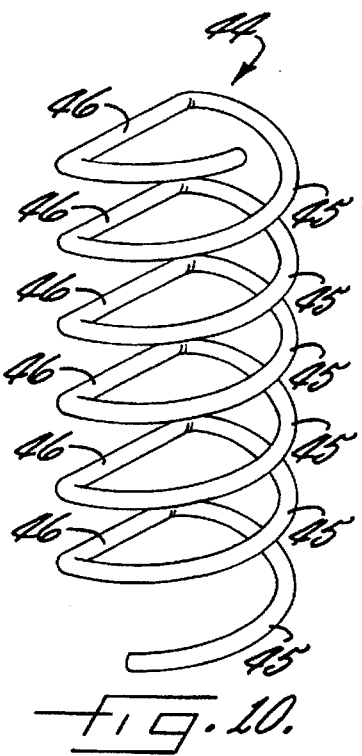

FIG. 10 illustrates a flattened cylindrical antenna 44 which is another new design which provides the advantages and uniformity associated with parallel current paths and without the losses associated with opposing currents. As FIG. 10 illustrates, the antenna comprises a longitudinally extending coil having a plurality of turns 45 of substantially the same radius. The substantially planar portion of the antenna is formed from linear portions 46 of at least some of the turns, the linear portions 46 being substantially parallel to one another and substantially coplanar with one another. In the antenna configuration of FIG. 10, all currents will run in the same direction, with a surface defined by the linear portions 46 forming a field that will generate a flat plasma. Thus, if the antenna 44 of FIG. 10 were incorporated into the plasma system of FIG. 4, the linear portions 46 would be adjacent the window 24 and the plasma 21.

Figure 11:
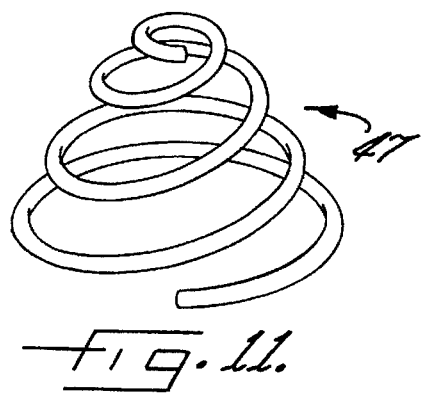

FIG. 11 illustrates an antenna 47 that comprises a spiraled electrode linearly extended along the axis of the spiral to form a frustoconical geometry. The center (i.e. the smallest turns) of the antenna are placed closest to the window in FIG. 4 to effectively increase the field at the center. Using the antenna illustrated in FIG. 11, the electromagnetic field on the plasma side of the window can be made more uniform, thus resulting in a plasma which is more uniform with little or no hole in the center. It will be thus understood that FIG. 11 is essentially not a flat electrode at all, but one that has an entirely different design.

Figure 12:
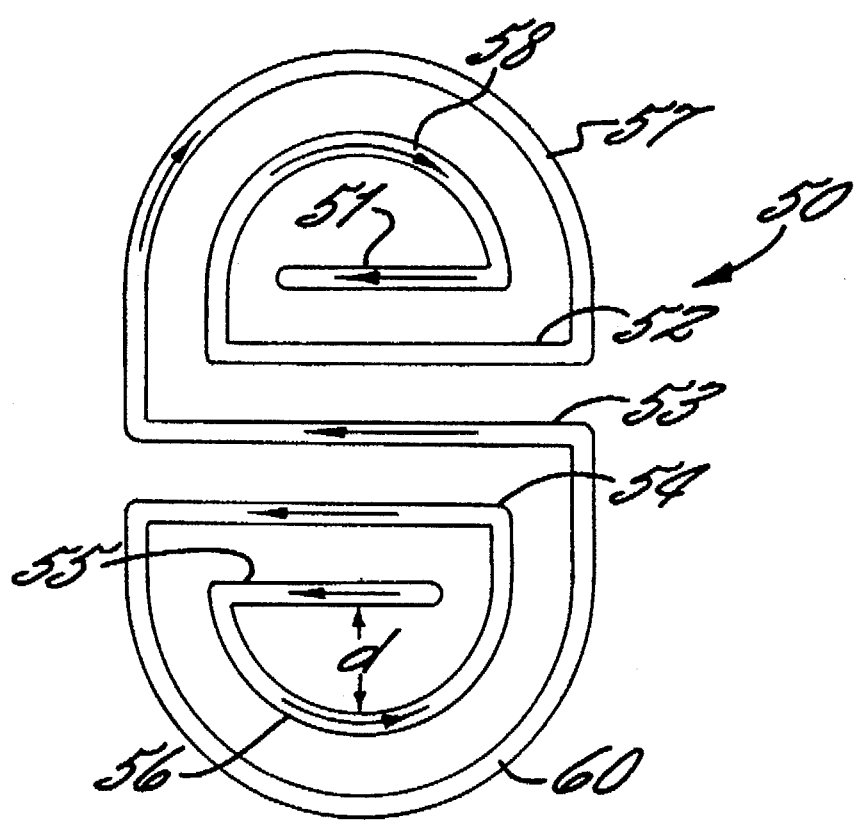

FIG. 12 illustrates a double "D"-shaped configuration 50 in which all of the center electrode-segment lengths 51–55 have current running in the same direction. Preferably, the distance d between the outer electrode segment 56, and the last inner parallel segment 55 is greater than the thickness of the dielectric. The electrode 50 of this embodiment has N number of top outer segments (two are illustrated at 57 and 58 in FIG. 12), N number of bottom outer segments (56 and 60 in FIG. 12), and 2N+1 parallel inner segments (51–55 in FIG. 12). Accordingly, it will be understood that the electrode 50 can be fabricated to various diameters using either greater or fewer numbers of segments. As will be understood by those familiar with plasma electrodes, the curved portions provide a completed current loop within the plasma and the two sets of loops illustrated in FIG. 12 permit the electrode to operate in either polarity.

In the embodiment of FIG. 12, the parallel paths of the inner segments, with all currents running in the same direction, minimizes cancellation of electric fields, while the outer loop segments permit a continuous current loop to be maintained in the plasma. The combination of these two attributes provides better plasma coupling efficiency.

As set forth earlier, conventional flat coil plasma electrode designs fail to provide a center plasma discharge at higher pressures and power densities. The designs set forth in FIGS. 5-12 establish more uniform plasmas by generating more uniform electric fields in the vicinity of the electrodes. These designs thus allow for improved plasma uniformity—temperature, pressure, and population—at higher densities or pressures for processes such as nucleation, growth and processing of diamond and diamond-like films. As stated earlier, such films have applications such as large area diamond coating or deposition for flat panel displays, emitter arrays, or wear-resistant coatings, optical or infrared windows, x-ray lithography masks, other diamond membranes, and specifically bias-enhanced nucleation of either hetero-epitaxial, highly oriented, or polycrystalline diamond films for a variety of applications.

In practice, the system schematically illustrated in FIG. 4 uses an enclosure which defines a near air-tight chamber wherein the plasma is generated and combined. The enclosure includes at least one inlet port for introduction of process gases and one outlet port for evacuation. An electrode according to the present invention is placed adjacent to the exterior of the enclosure in order to induce the desired plasma. When a radio frequency current is introduced and induced within the coil, a magnetic field is in turn induced which induces the flow of electrons within a planar region nearly parallel to the plane of the coil. FIG. 4 illustrates that the electrode is separated from the plasma by a dielectric shield or "window" material that allows the electric fields to penetrate with the enclosure and will also provide an air-tight seal between the inside and the outside of the vessel. As noted earlier, the window material is usually quartz, and the remainder of the enclosure is usually metal.

This plasma system can also include appropriate electrostatic shields which limit the formation of electrostatic mode or capacitively-coupled (i.e., weaker) plasma modes. To be effective, these shields must be closely spaced and oriented at right angles with respect to the coil itself.

In each case, the coils according to the present invention will be driven by a radio frequency (RF) generator of a type generally utilized in the operation of plasma equipment and of which many examples are well known to those of ordinary skill in the art and can be selected without undue experimentation. Such an RF generator typically operates at a frequency of between about 13.56 megahertz to 100 megahertz, typically being operated in the lower end of that region at 13.56 megahertz. The RF generator should have a relatively low impedance, typically about 50 ohms, and should be capable of producing between about 1 and 6 amps, with a root mean square (RMS) voltage of at least about 50 volts, usually at least about 70 volts or more. Such RF generators are usually connected to the coil in the form of a coaxial cable in a manner well known to those of ordinary skill in this art.

The relationship between the plasma and the semiconductor material upon which it acts can be developed relatively straightforwardly, and there are a number of appropriate examples of such arrangements in the prior art. One is given in U.K. Patent Application No. GB 2 231 197 A, particularly in FIG. 1.

A similar arrangement for a substrate is illustrated in Hopwood et al., *Langmuir Probe Measurements of a Radio Frequency Induction Plasma*, Journal of Vac. Sci. Technol. A., Vol. 11, No. 1, pp. 152-156, particularly in FIG. 1 which shows an RF induction plasma arrangement in which a planar coil is positioned above a quartz vacuum window and a substrate holder is below the vacuum window in the area in which the plasma is generated.

The substantially identical arrangement is also set forth in a second related article, Hopwood et al., *Electromagnetic Fields in a Radio Frequency Induction Plasma*, Journal of Vac. Sci. Technol. A., Vol. 1, No. 1, pp. 147-151.

A third illustration of essentially the same device is set forth in Hopwood, *Review of Inductively Coupled Plasmas for Plasma Processing*, Plasma Sources Science and Technology, Vol. 1, pp. 109-116 (1992).

A fourth example is set forth in U.S. Pat. No. 4,948,458 to Ogle, particularly FIGS. 1 and 2. In short summary, these references demonstrate that an appropriate apparatus for incorporating the coil geometries of the present invention can be readily selected and operated by those of ordinary skill in this art, and without undue experimentation.

In a further aspect of the invention, the advantages described earlier that are provided by an external magnetic field can be applied to and combined with the advantages provided by the flat coil geometries of the present invention. As noted above, the application of a magnetic field to a higher pressure plasma provides a more uniform plasma as well as an additional means for controlling that plasma. These advantages of the external magnetic field can be combined with the uniformity advantages provided by the flat coil geometries of the present invention to further enhance the overall uniformity and usefulness of a flat-surfaced plasma.

In the drawings and specifications, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of controlling an inductively coupled plasma comprising applying an external magnetic field other than the field associated with the induction field to an inductively coupled plasma while maintaining the gas pressure of the plasma high enough so that the collision frequencies of the plasma particles are substantially greater than the induction frequency applied to the plasma.

2. A method according to claim 1 wherein the step of applying an external magnetic field further comprises varying the magnetic field over time.

3. A method according to claim 1 wherein the step of applying an external magnetic field further comprises varying the magnetic field over space.

4. A method according to claim 1 wherein the step of applying an external magnetic field to the plasma comprises applying a uniform magnetic field.

5. A method according to claim 1 and further comprising the step of rotating the magnetic field.

6. A method according to claim 1 and further comprising the step of rotating the coil axis.

7. A method according to claim 1 in which the gas pressure in the plasma is between about 100 mtorr and 100 torr.

8. A method according to claim 1 wherein the step of maintaining the gas pressure high enough comprises maintaining the gas pressure at 5 Pa or greater.

9. A method of controlling an inductively coupled plasma, and comprising:

applying electromagnetic energy to an induction coil that surrounds a partially ionized working gas while maintaining the gas pressure of the plasma high enough so that the collision frequencies of the plasma particles are substantially greater than the induction frequency applied to the plasma to thereby define an ionization region and raise the temperature of the gas sufficiently for the gas to obtain the plasma state; and applying an external magnetic field other than the magnetic field associated with the induction field produced by the induction coil to the inductively coupled plasma.

10. A method according to claim 9 wherein the step of applying the external magnetic field comprises applying the field parallel to the axis of the induction coil.

11. A method according to claim 9 wherein the step of applying the external magnetic field comprises applying the field perpendicular to the axis of the induction coil.

12. A method according to claim 9 wherein the step of applying the external magnetic field comprises applying the field obliquely to the axis of the induction coil.

13. A method according to claim 9 and further comprising the steps of initiating and sustaining a plasma in the ionization region.

14. A method according to claim 9 and further comprising the step of establishing a plasma column in the ionization region.

15. A method according to claim 14 and further comprising the step of rotating the plasma column within the ionization region.

16. A method according to claim 9 wherein the step of applying the magnetic field comprises applying a magnetic field sufficient to increase the electromagnetic field penetration of the plasma.

17. A method according to claim 9 wherein the step of applying the magnetic field comprises applying a magnetic field sufficient to increase the electromagnetic field penetration of the plasma entirely to the center of the plasma.

18. A method according to claim 9 wherein the step of applying electromagnetic energy to a working gas comprises applying the energy to a working gas maintained at a pressure at least as great as atmospheric pressure.

19. An inductively coupled plasma system comprising:

an ionized gas maintained at a pressure high enough so that the collision frequencies of the plasma particles are substantially greater than the induction frequency applied to the plasma; and an external magnetic field applied to said ionized gas other than the magnetic field associated with the induction field.

20. A plasma system according to claim 19 and further comprising:

a tube for containing said high pressure ionized gas;

an induction coil surrounding said tube and defining an axis of said tube; and means for supplying said coil with radio frequency power.

21. A plasma system according to claim 20 wherein said tube comprises a quartz tube, said radio frequency power means comprises a radio frequency generator, and said induction coil comprises copper tubing.

22. A plasma system according to claim 20 and further comprising means for varying said magnetic field over space with respect to said axis of said tube.

23. A plasma system according to claim 20 and further comprising means for varying said magnetic field over time.

24. A plasma system according to claim 19 and further comprising means for applying a magnetic field to said ionized gas.

25. A plasma system according to claim 19 comprising an ionized gas maintained at a pressure of between about 100 mtorr and 100 torr.

26. A plasma system according to claim 19 wherein said ionized gas is maintained at a pressure of 5 Pa or greater.

27. An antenna for producing a uniform plasma at pressures of at least one torr, said antenna comprising at least one portion that forms a substantially planar configuration other than an Archimedean spiral.

28. An antenna according to claim 27 wherein the configuration of said antenna will produce a substantially uniform field at pressures of 100 mtorr or higher.

29. A plasma antenna according to claim 27 wherein said substantially planar portion comprises a single noncircular loop.

30. A plasma antenna according to claim 27 wherein said substantially planar portion comprises the configuration of FIG. 5.

31. A plasma antenna according to claim 27 wherein said substantially planar portion comprises a non-Archimedean coil in which the turns are tighter toward the center of the coil and greater toward the circumference of the coil.

32. A plasma antenna according to claim 27 wherein said substantially planar portion comprises the configuration of FIG. 6.

33. A plasma antenna according to claim 27 wherein said substantially planar portion comprises a series of substantially parallel portions connected by turns at the respective alternating ends of said parallel portions.

34. A plasma antenna according to claim 27 wherein said substantially planar portion comprises the configuration of FIG. 7.

35. A plasma antenna according to claim 27 wherein said substantially planar portion comprises multiple concentric coils.

36. A plasma antenna according to claim 27 wherein said substantially planar portion comprises the configuration of FIG. 8.

37. A plasma antenna according to claim 27 wherein said substantially planar portion comprises:

a circular perimeter;

a central hub coaxial with said perimeter; and a plurality of substantially linear spokes radiating from said hub to said circular perimeter.

38. A plasma antenna according to claim 27 wherein said substantially planar portion comprises the configuration of FIG. 9.

39. A plasma antenna according to claim 27 wherein said antenna comprises a longitudinally extending coil having a plurality of turns of substantially the same radius, and wherein said substantially planar portion of said antenna comprises linear portions of at least some of said turns, said linear portions being substantially parallel to one another and substantially coplanar with one another.

40. A plasma antenna according to claim 27 wherein said substantially planar portion comprises the configuration of FIG. 10.

41. A plasma antenna according to claim 27 wherein said substantially planar portion comprises:

a first set of outer curved segments for completing a current loop; and a set of substantially linear center electrode-segment lengths adjacent said first curved segment set and in electrical communication with said curved segment set, for sending current in the same direction in each of segment of said center set.

42. A plasma antenna according to claim 41 and further comprising a second set of outer curved segments opposite said first set, and wherein said center electrode segments are positioned between said first and second curved segment sets, and wherein said second curved segment set is in electrical communication with said first curved segment set and with said center segment set.

43. A plasma antenna according to claim 42 wherein:

said first set has N number of outer curved segments;

said second set has N number of outer curved segments; and said center set has (2N+1) linear segments.

44. A plasma antenna according to claim 27 wherein said substantially planar portion comprises the configuration of FIG. 12.

45. A plasma antenna having the configuration of FIG. 11.

46. A plasma antenna that comprises a spiraled electrode linearly extended along the axis of the spiral to form a frustoconical geometry.

47. A plasma antenna according to claim 46 wherein said spiraled electrode forms an Archimedean spiral.

48. A plasma antenna according to claim 46 wherein said spiraled electrode forms a non-Archimedean spiral.

49. A plasma system comprising:

a vessel suitable for containing a plasma at a pressure of at least about 100 mtorr;

a plasma gas in said vessel at a pressure of at least 100 mtorr;

an antenna with a substantially planar face positioned adjacent a portion of said vessel for applying an electromagnetic field to said plasma gas to thereby generate and maintain a plasma; and means for applying an external magnetic field to the plasma gas other than the field generated by said antenna, and having a component in a direction substantially perpendicular to said planar face of said antenna.

50. A plasma system according to claim 49 wherein said magnetic field means comprises a magnet.

51. A plasma system according to claim 49 wherein said magnetic field means comprises a magnetic coil.

52. A plasma system according to claim 49 and further comprising a radio frequency generator for applying a radio frequency signal to said antenna.

53. A plasma system according to claim 49 wherein said vessel comprises a quartz tube.

54. A plasma system according to claim 49 wherein said vessel comprises a metal tube with a quartz window adjacent said antenna.

55. A plasma system according to claim 49 wherein said antenna comprises copper tubing.

56. A plasma system according to claim 49 and further comprising means for spatially varying said magnetic field.

57. A plasma system according to claim 49 and further comprising means for varying said magnetic field over time.

58. A method of generating a uniform inductively coupled plasma at pressures of at least about 100 mtorr, said method comprising:

applying an electromagnetic field from a substantially planar antenna to a plasma gas at a pressure of at least about 100 mtorr to thereby generate and maintain a plasma; and applying an external magnetic field to the plasma gas other than the field generated by the substantially planar antenna, said applied external magnetic field having a component in a direction substantially perpendicular to the planar face of said antenna.

59. A method of generating a plasma according to claim 58 wherein the step of applying an electromagnetic field comprises applying a field with a frequency of between about 1 megahertz (MHZ) and 1 gigahertz (GHZ).

60. A method of generating a plasma according to claim 58 wherein the step of applying the electromagnetic field to the plasma gas comprises applying the electromagnetic field to a gas selected from the group consisting of argon, hydrogen, and alkane and olefin hydrocarbon gases.

61. A method of generating a plasma according to claim 58 wherein the step of applying an external magnetic field to the plasma gas comprises applying a magnetic field of at least about 100 Gauss.

62. A method according to claim 58 wherein the step of applying the magnetic field comprises applying a magnetic field sufficient to increase the electromagnetic field penetration of the plasma.

63. A method according to claim 58 wherein the step of applying the magnetic field comprises applying a magnetic field sufficient to increase the electromagnetic field penetration of the plasma entirely to the center of the plasma.

\* \* \* \* \*